(12) United States Patent
Kim et al.

(10) Patent No.: US 6,277,710 B1
(45) Date of Patent: Aug. 21, 2001

(54) METHOD OF FORMING SHALLOW TRENCH ISOLATION

(75) Inventors: Hyun Tae Kim; Kam Chew Leong; Elgin Kiok Boone Quek, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/439,358

(22) Filed: Nov. 15, 1999

(51) Int. Cl.[7] ........................... H01L 21/76
(52) U.S. Cl. ............... 438/431; 438/424; 438/430
(58) Field of Search ............................ 438/424, 425, 438/426, 430, 431

(56) References Cited

U.S. PATENT DOCUMENTS

| 4,671,970 | 6/1987 | Keiser et al. ................ 427/93 |
| 5,804,493 | 9/1998 | Juang et al. ................ 438/440 |
| 5,811,345 | 9/1998 | Yu et al. ..................... 438/424 |
| 5,837,612 | 11/1998 | Ajuria et al. ................ 438/697 |
| 5,895,254 | 4/1999 | Huang et al. ............... 438/424 |
| 5,923,991 | 7/1999 | Bronner et al. ............. 438/424 |
| 5,930,645 | * | 7/1999 | Lyons et al. ................ 438/424 |
| 5,998,278 | * | 12/1999 | Yu ............................... 438/424 |

* cited by examiner

*Primary Examiner*—Richard Elms
*Assistant Examiner*—Brad Smith
(74) *Attorney, Agent, or Firm*—George O. Saile; Rosemary L. S. Pike

(57) ABSTRACT

A method of forming shallow trench isolations wherein trench oxide grooving due to etch stop layer etching is eliminated by the formation of a liner oxidation overlying a polysilicon layer. A semiconductor substrate is provided. A pad oxide layer is grown. A polysilicon layer is deposited. Optionally, the polysilicon layer may be ion implanted to increase the oxidation rate. A silicon nitride layer is deposited. The silicon nitride layer, the polysilicon layer, the pad oxide layer and the semiconductor substrate are patterned to form trenches for planned shallow trench isolations. A liner oxidation layer is grown overlying the semiconductor substrate, the pad oxide layer, and the polysilicon layer inside the trenches. A trench oxide layer is deposited overlying said silicon nitride layer and filling said trenches. The trench oxide layer is polished down to the silicon nitride layer. The silicon nitride layer, the polysilicon layer, the pad oxide layer are etched away. The presence of the liner oxidation layer and the oxidized polysilicon layer protect the trench oxide layer during the etching of the silicon nitride layer, the polysilicon layer, and the pad oxide layer. The integrated circuit is completed.

18 Claims, 5 Drawing Sheets

METHOD OF FORMING SHALLOW TRENCH ISOLATION

BACKGROUND OF THE INVENTION

(1) Field of the Invention

The invention relates to a method of fabricating semiconductor structures, and more particularly, to a method of forming a shallow trench isolation in the manufacture of integrated circuit devices.

(2) Description of the Prior Art

Shallow trench isolation (STI) is an important enabling technology for processes with device sizes 0.25 microns and below. STI technology makes possible the formation of active area isolations with reduced surface area and flatter topology than with local oxidation of silicon (LOCOS) schemes. Polishing and etch stop layers must be completely removed after the formation of the STI. It is difficult to remove these layers without creating defects in the trench oxide of the STI. The present invention addresses this problem.

Referring now to FIG. 1, a cross-section of a partially completed prior art integrated circuit device is shown. A shallow trench isolation will be formed using a prior art method. A semiconductor substrate 10 is shown. A pad oxide layer 14 is formed overlying the semiconductor substrate 10. A silicon nitride layer 18 is formed overlying the pad oxide layer 14. The silicon nitride layer 18, pad oxide layer 14, and the semiconductor substrate 10 are patterned to form the trench for an STI. A trench oxide layer 22 is deposited overlying the silicon nitride layer 18 and filling the trench.

Referring now to FIG. 2, the trench oxide layer 22 is polished down. The silicon nitride layer 18 acts as a polishing stop.

Referring now to FIG. 3, the silicon nitride layer 18 and the pad oxide layer 14 are etched away. This etching away typically involves a wet etch using a chemistry such as diluted hydrofluoric acid (HF). This etching away step can cause a grooving 26 of the trench oxide layer 22 along the top corners of the STI. The grooves 26 can cause excessive junction leakage for active devices fabricated adjacent to the grooved STI. In addition, MOS devices fabricated adjacent to the grooved STI can experience gate oxide thinning at the boundary that can reduce the gate breakdown voltage.

Several prior art approaches disclose methods to form shallow trench isolations. U.S. Pat. No. 5,804,493 to Juang et al teaches a process to form local oxidation of silicon (LOCOS). A stack is formed comprising silicon nitride over polysilicon over pad oxide over the semiconductor substrate. The silicon nitride and polysilicon are etched to form masks overlying planned active areas. Field oxide is formed by thermal oxidation of the semiconductor substrate. The silicon nitride and polysilicon layers are stripped to complete the LOCOS. U.S. Pat. No. 5,811,345 to Yu et al discloses a method to form STI. A stack is formed comprising polysilicon over nitride over pad oxide over a semiconductor substrate. A trench is etched. Ozone TEOS is deposited to fill the trench. An HF dip is performed to planarize the trench oxide. A plasma etch removes the trench oxide down to the polysilicon layer to complete the STI. U.S. Pat. No. 5,837,612 to Ajuria et al discloses a method to form STI. A polysilicon layer is deposited over an oxide layer that overlies the semiconductor substrate. A thermal oxidation is performed to form an oxide layer over the polysilicon layer and to line the trench. An oxide fill layer is deposited to fill the trench. A reverse mask is used to etch down the oxide fill outside the trench. A CMP is performed to polish down the oxide fill to the top of the oxide over the polysilicon. The polysilicon layer is then etched away. U.S. Pat. No. 4,671,970 to Keiser et al teaches a method to form STI. Trenches are etched into the semiconductor substrate. A stack of polysilicon overlying silicon nitride overlying silicon dioxide is formed overlying the substrate and inside the trenches. A CVD oxide is deposited to fill the trenches. The oxide is etched away excepting corner fillets in the lower corners of the trenches. A second oxide is grown by thermal process to fill the trenches. U.S. Pat. No. 5,923,991 to Bronner et al discloses a method to prevent divot formation in an STI process. A silicon nitride layer and silicon nitride spacers are used. U.S. Pat. No. 5,895,254 to Huang et al teaches a method to form STI. Silicon nitride is formed over pad oxide over the substrate. An opening is etched through the silicon nitride. A trench is etched into the substrate using the silicon nitride as a mask. A liner oxide is formed. A trench oxide is formed and polished down. The silicon nitride is etched away. Spacers are formed in the pad oxide at the trench edges. The pad oxide is removed to complete the STI.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations where trench oxide grooving is eliminated.

A still further object of the present invention is to provide a method to fabricate shallow trench isolations where trench oxide grooving is eliminated through the deposition of a polysilicon layer and the thermal oxidation of the polysilicon layer and the trench interior.

In accordance with the objects of this invention, a new method of forming shallow trench isolations has been achieved. A semiconductor substrate is provided. A pad oxide layer is grown overlying the semiconductor substrate. A polysilicon layer is deposited overlying the pad oxide layer. A silicon nitride layer is deposited overlying the polysilicon layer. The silicon nitride layer, the polysilicon layer, the pad oxide layer and the semiconductor substrate are patterned to form trenches for planned shallow trench isolations. A liner oxidation layer is grown overlying the semiconductor substrate, the pad oxide layer, and the polysilicon layer inside the trenches. A portion of the polysilicon layer at the trench edge is oxidized also. A trench oxide layer is deposited overlying said silicon nitride layer and filling said trenches. The trench oxide layer is polished down to the silicon nitride layer. The silicon nitride layer is etched away. The polysilicon layer is etched away. The pad oxide layer is etched away. The presence of the oxidized polysilicon layer together with the liner oxidation layer protects the trench oxide layer during the etching of the silicon nitride layer, the polysilicon layer, and the pad oxide layer. The integrated circuit is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of shallow trench isolations in the manufacture of an integrated circuit device. It should be clear to those experienced in the art that the present invention can be applied and extended without deviating from the scope of the present invention.

Figure 1:
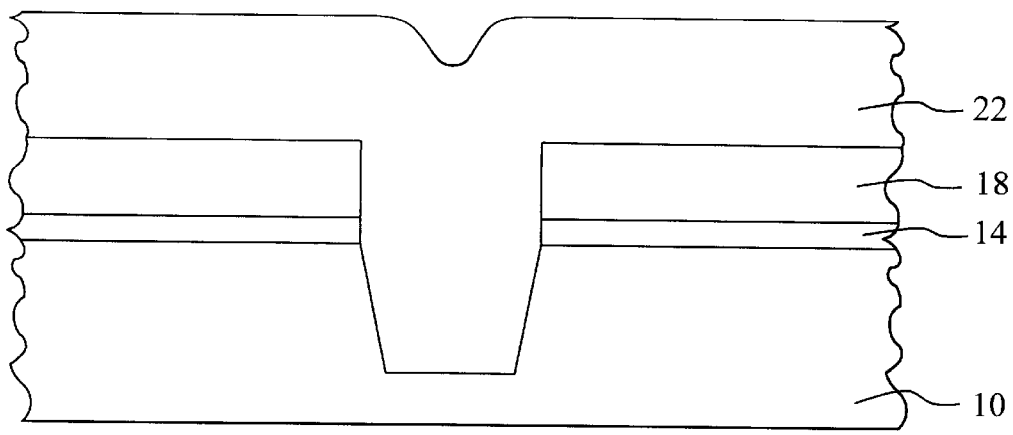
FIGS. 1 through 3 schematically illustrate in cross-section a partially completed prior art integrated circuit device.
Figure 2:
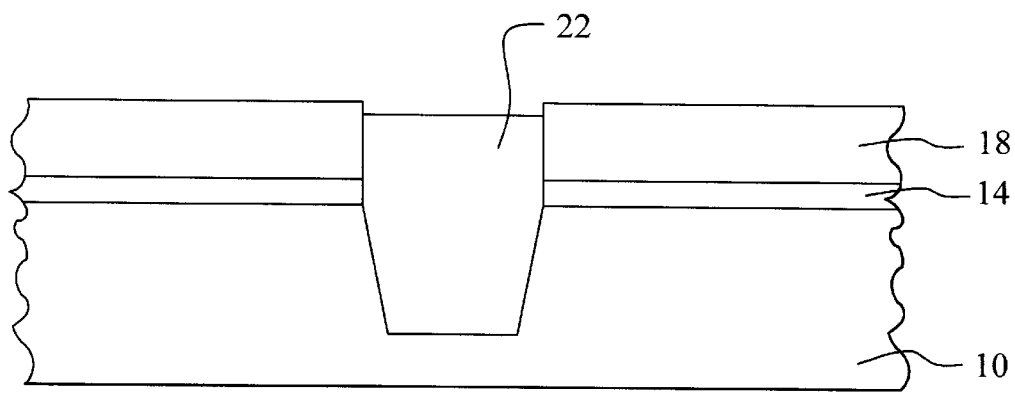
Figure 3:
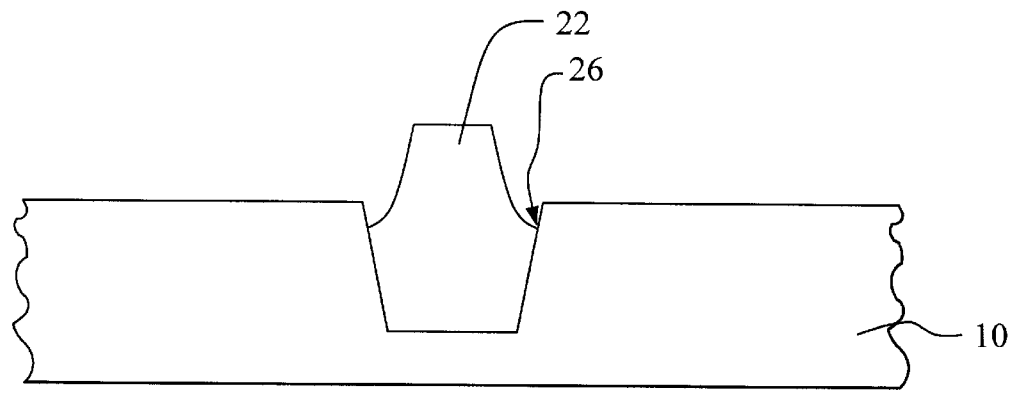
Figure 4:
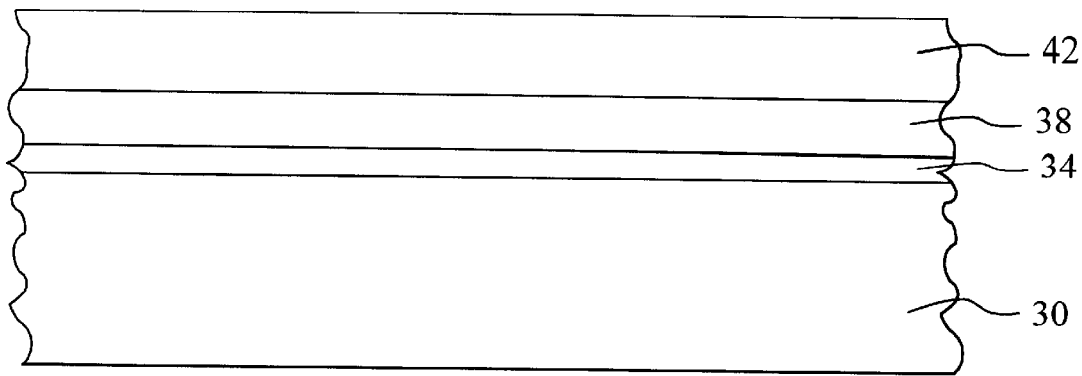
FIGS. 4 through 13 schematically illustrate in cross-sectional representation the preferred embodiment of the present invention.

Referring now particularly to FIG. 4, there is shown a cross section of a partially completed integrated circuit device of the preferred embodiment. A semiconductor substrate 30, typically consisting of monocrystalline silicon, is provided. A pad oxide layer 34 is grown overlying the semiconductor substrate 30. The pad oxide layer 34 is used to relieve surface stress in the semiconductor substrate 30 and to improve the adhesion of the polysilicon layer 38. The pad oxide layer 34 is conventionally grown using a thermal oxidation to a thickness of between about 90 Angstroms and 110 Angstroms.

An important part of the present invention is then disclosed. A polysilicon layer 38 is deposited overlying the pad oxide layer 34. As will be seen, the novel use of the polysilicon layer 38 here will effectively prevent the grooving problem seen in the prior art. The polysilicon layer 38 is conventionally deposited by a low pressure chemical vapor deposition (LPCVD). The polysilicon layer 38 is deposited to a thickness of between about 400 Angstroms and 600 Angstroms. As an option, the polysilicon layer 38 may be ion implanted immediately after deposition. This ion implantation will increase the oxidation rate of the polysilicon layer 38 so that the polysilicon layer 38 will oxidize much faster than the semiconductor substrate 30.

A silicon nitride layer 42 is deposited overlying the polysilicon layer 38. The silicon nitride layer 42 is a polishing stop for the subsequent polish down step. The silicon nitride layer 42 is deposited using a low-pressure chemical vapor deposition (LPCVD) to a thickness of between about 1,800 Angstroms and 2,200 Angstroms.

Figure 5:
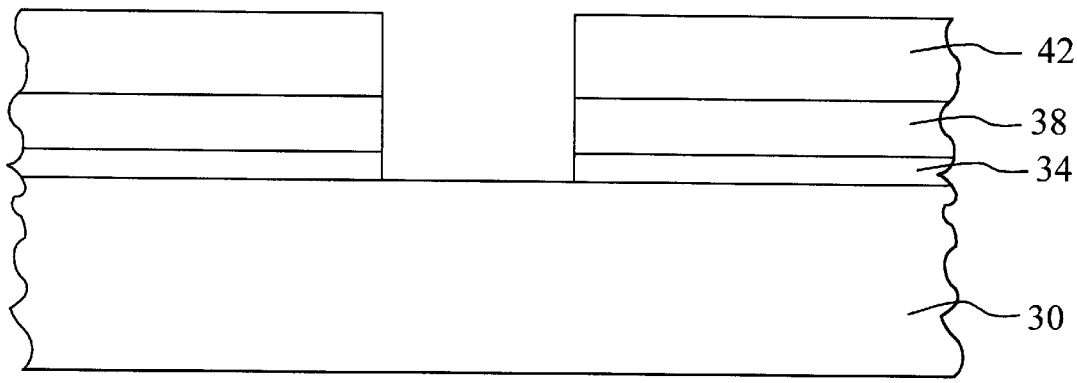

Referring now to FIG. 5, the silicon nitride layer 42, the polysilicon layer 38, and the pad oxide layer 34 are patterned to form a hard mask for planned shallow trench isolations. A conventional photolithographic process may be used to first form a photolithographic mask. A reactive ion etch (RIE) is performed to etch through each layer. The RIE process comprises an etching chemistry of, for example, $Cl_2$, HBr, and $O_2$ for etching the semiconductor substrate 30, pad oxide layer 34, and polysilicon layer 38, and $CH_3F$, $O_2$, and Ar for etching the silicon nitride layer 42.

Figure 6:
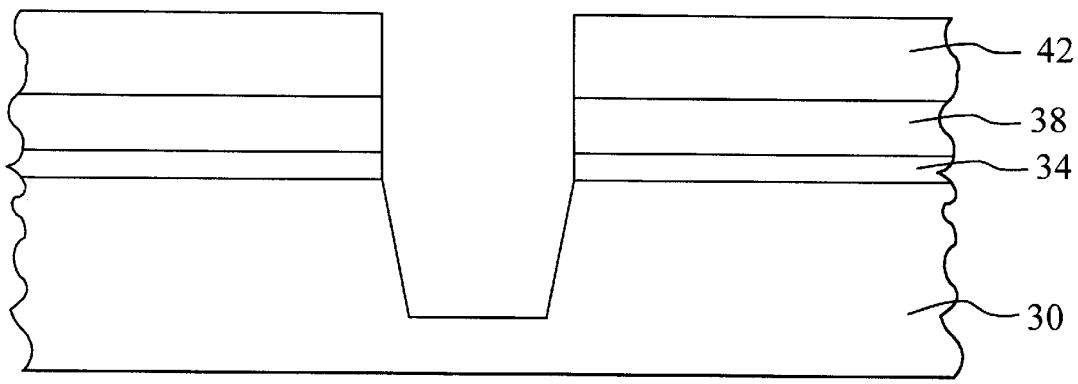

Referring now to FIG. 6, the semiconductor substrate 30 is etched through to form trenches for planned shallow trench isolations. The semiconductor substrate 30 is etched using a conventional reactive ion etch.

Figure 7:
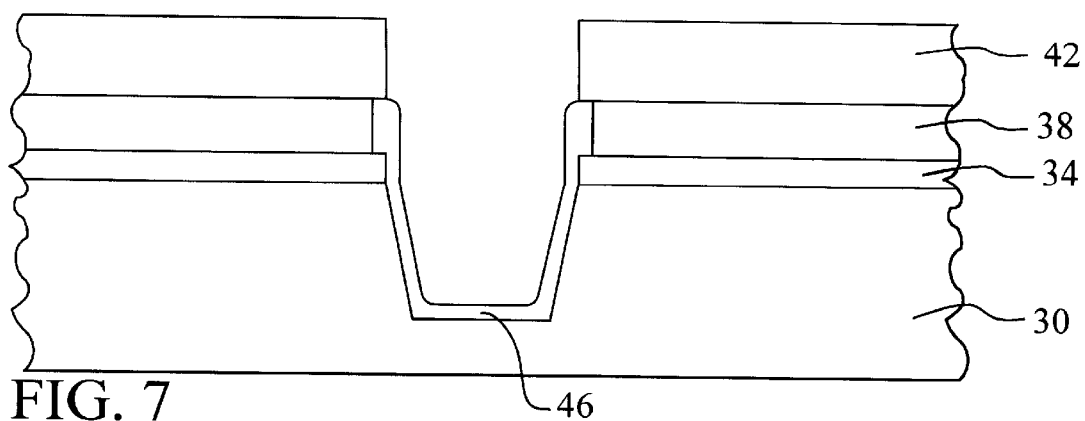

Referring now to FIG. 7, an important feature of the present invention is illustrated. A liner oxidation layer 46 is grown overlying the semiconductor substrate 30, the pad oxide layer 34, and the polysilicon layer 38 inside the trenches. The liner oxidation layer 46 serves two purposes. First, it improves the roundness of the trench. This can reduce junction leakage. Second, and more important for the present invention, the liner oxidation layer 46 forms a protective oxidation overlying the polysilicon layer 38 and the pad oxide layer 34. This protective oxidation will protect the subsequently deposited trench oxide layer from grooving during the etch processes used to remove the silicon nitride layer 42, the polysilicon layer 38, and the pad oxide layer 34. The fact that the polysilicon layer 38 can be oxidized to form the liner oxidation layer 46 is important to the present invention. In addition, if the optional ion implantation of the polysilicon layer 38 will cause the polysilicon layer 38 to oxidize more quickly than the semiconductor substrate 30 and therefore form a thicker liner oxidation layer 46 in the polysilicon.

The liner oxidation layer 46 is grown using a thermal oxidation at a temperature of between about 900 degrees C. and 1,100 degrees C. for between about 8 minutes and 10 minutes. The liner oxidation layer 46 is grown to a thickness of between about 230 Angstroms and 270 Angstroms.

Figure 8:
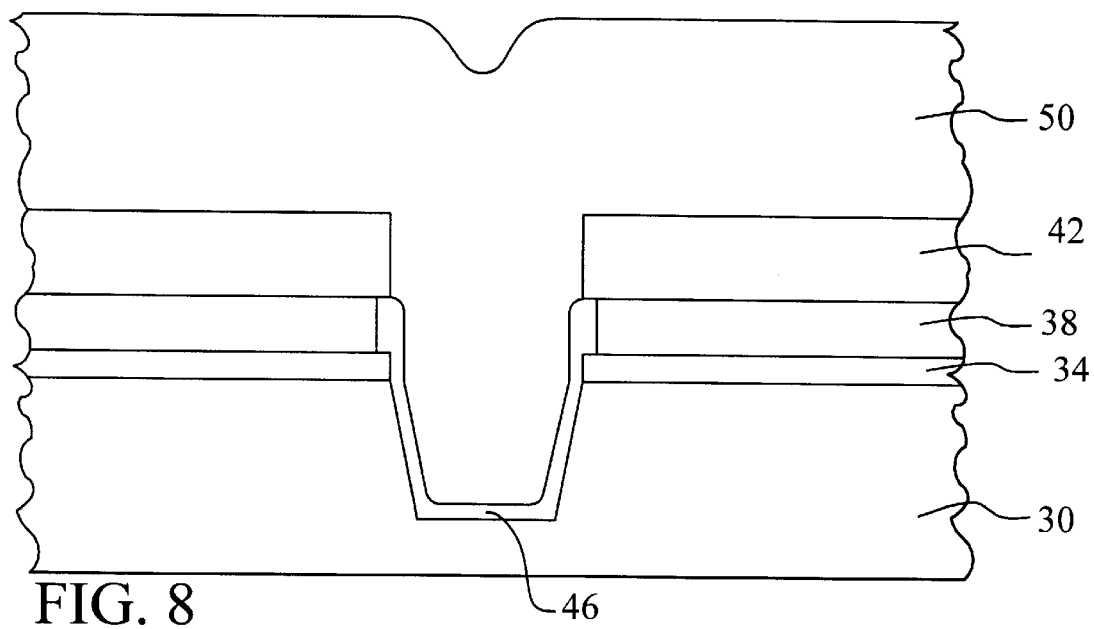

Referring now to FIG. 8, a trench oxide layer 50 is deposited overlying the silicon nitride layer 42 and filling the trenches. The trench oxide layer 50 preferably comprises a silicon dioxide that may be deposited by a high density plasma (HDP) or by a LPCVD. The deposition temperature is between about 560 degrees C. and 600 degrees C. The trench oxide layer 50 is deposited to a thickness of between about 6,200 Angstroms and 6,900 Angstroms.

Figure 9:
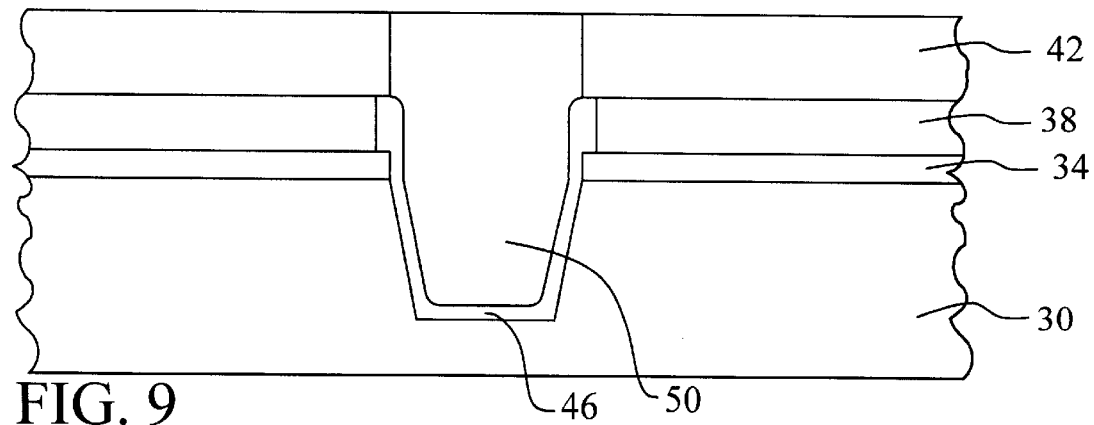

Referring now to FIG. 9, the trench oxide layer 50 is polished down to the silicon nitride layer 42. The polish down step is performed using a conventional chemical mechanical polish (CMP). The preferable CMP slurry chemistry removes the trench oxide layer 50 more rapidly than the silicon nitride layer 42.

Figure 10:
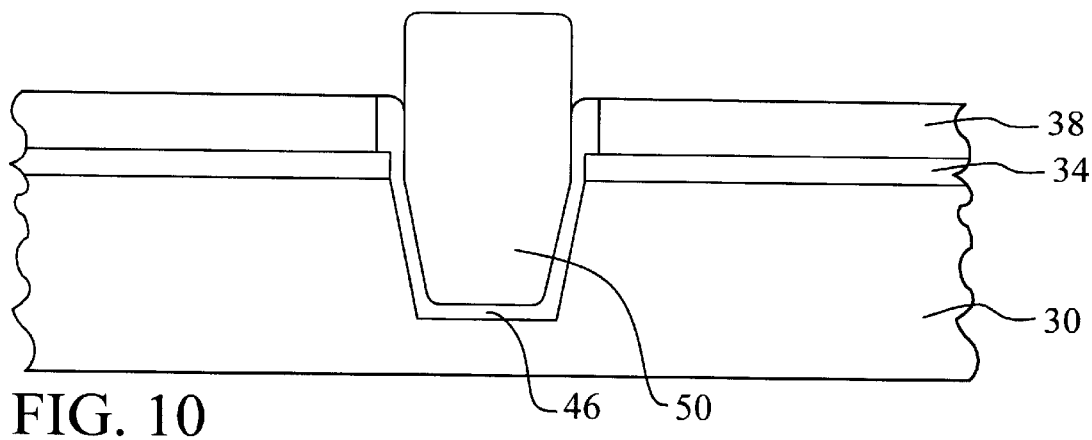

Referring now to FIG. 10, the silicon nitride layer 38 is etched away. The presence of the oxidized polysilicon layer 38 and the liner oxidation layer 46 protect the trench oxide layer 50 during this etch. The silicon nitride layer 38 is etched away preferably by a hot phosphoric acid ($H_3PO_4$) etch.

Figure 11:
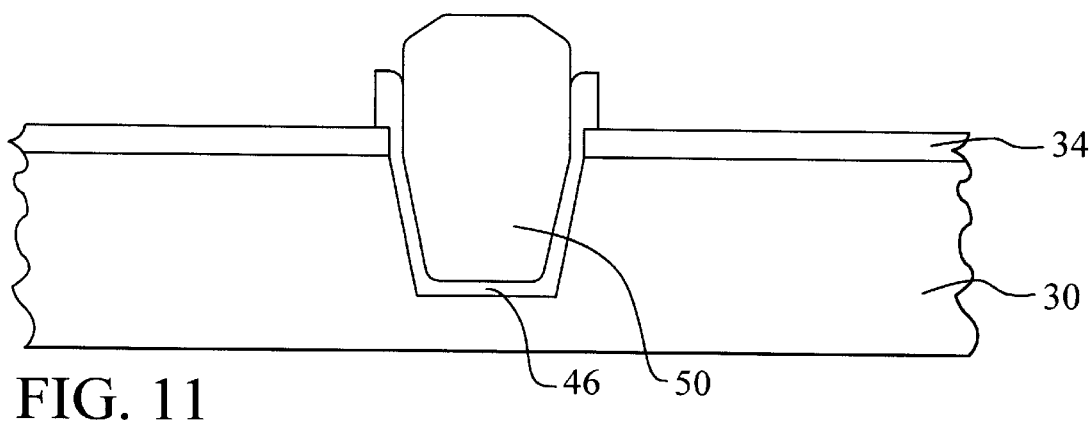

Referring now to FIG. 11, the polysilicon layer 38 is etched away. The presence of the oxidized polysilicon layer 38 and the liner oxide layer 46 again protect the trench oxidation layer 50 during the polysilicon layer 38 etch. This etch may be performed using a conventional wet etch (such as KOH) or a dry etch.

Figure 12:
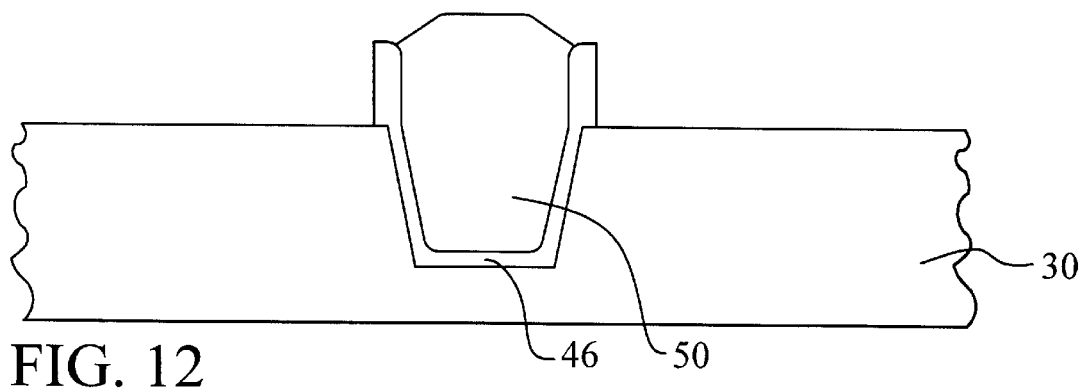

Referring now to FIG. 12, the pad oxide layer 34 is etched away, and the integrated circuit is completed. The pad oxide layer 34 is etched using a conventional wet etch such as hydrofluoric acid (HF). The presence of the oxidized polysilicon layer 38 and the liner oxide layer 46 again protect the trench oxidation layer 50 during the etch.

Now the specific advantages of the present invention compared to the prior art can be listed. First, the novel liner oxidation layer extending up and into the polysilicon layer prevents grooving of the trench oxide layer during the etching of the polishing stop and pad oxide layers. Second, the prevention of the grooving eliminates the gate oxide thinning problem seen in the prior art.

Figure 13:
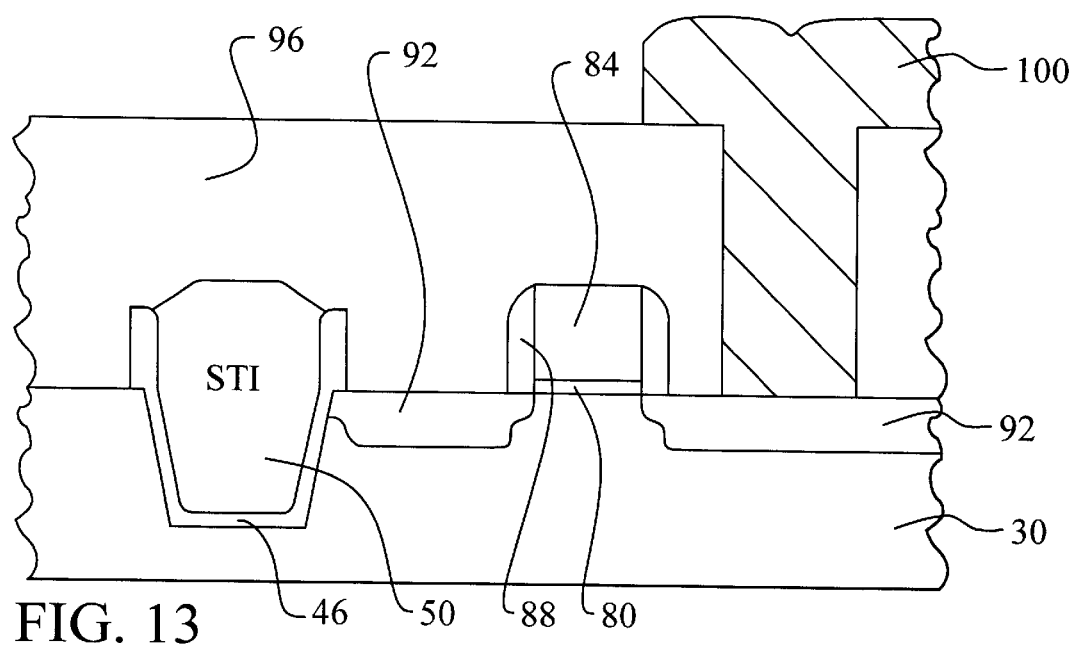

The integrated circuit can now be completed as is conventional in the art. For example, FIG. 13 illustrates a gate electrode 84 and associated source and drain regions 92 fabricated in the active region between the STI 50 of the present invention. An electrical connection is made between one of the source and drain regions 92 and a conducting line 100 made through a dielectric layer 96.

As shown in the preferred embodiments, the present invention provides a very manufacturable process for fabricating shallow trench isolations in an integrated circuit device. The present invention eliminates trench oxide grooving.

While the invention has been particularly shown and described with reference to the preferred embodiments thereof, it will be understood by those skilled in the art that various changes in form and details may be made without departing from the spirit and scope of the invention.

What is claimed is:

1. A method to form shallow trench isolations in the manufacture of an integrated circuit device comprising:

providing a semiconductor substrate;

depositing a polysilicon layer overlying said semiconductor substrate;

ion implanting said polysilicon layer to increase the oxidation rate of said polysilicon layer;

depositing a silicon nitride layer overlying said polysilicon layer;

patterning said silicon nitride layer, said polysilicon layer, and said semiconductor substrate to form trenches for planned shallow trench isolations;

growing a liner oxidation layer overlying said semiconductor substrate and said polysilicon layer inside said trenches wherein a portion of said polysilicon layer adjacent to said inside of said trenches is oxidized;

depositing a trench oxide layer overlying said silicon nitride layer and filling said trenches;

polishing down said trench oxide layer to said silicon nitride layer;

etching away said silicon nitride layer wherein said liner oxidation layer and oxidized said polysilicon layer protect said trench oxide layer during said etching away; and etching away said polysilicon layer to complete said shallow trench isolations in the manufacture of said integrated circuit wherein said liner oxidation layer and said oxidized polysilicon layer protect said trench oxide layer during said etching away.

2. The method according to claim 1 wherein said polysilicon layer is deposited to a thickness of between about 400 Angstroms and 600 Angstroms.

3. The method according to claim 1 wherein said silicon nitride layer is deposited to a thickness of between about 1,800 Angstroms and 2,200 Angstroms.

4. The method according to claim 1 wherein said step of growing said liner oxidation layer is by a thermal oxidation at a temperature of between about 900 degrees C. and 1,100 degrees C. for between about 8 minutes and 10 minutes.

5. The method according to claim 1 wherein said liner oxidation layer is grown to a thickness of between about 230 Angstroms and 270 Angstroms.

6. The method according to claim 1 wherein said trench oxide layer is deposited to a thickness of between about 6,200 Angstroms and 6,900 Angstroms.

7. The method according to claim 1 wherein said step of polishing down is by a chemical mechanical polish.

8. The method according to claim 1 further comprising:

growing a pad oxide layer overlying said semiconductor substrate prior to said step of depositing said polysilicon layer; and etching away said pad oxide layer after said step of etching away said polysilicon layer.

9. A method to form shallow trench isolations in the manufacture of an integrated circuit device comprising:

providing a semiconductor substrate;

growing a pad oxide layer overlying said semiconductor substrate;

depositing a polysilicon layer overlying said pad oxide layer;

depositing a silicon nitride layer overlying said polysilicon layer;

patterning said silicon nitride layer, said polysilicon layer, said pad oxide layer, and said semiconductor substrate to form trenches for planned shallow trench isolations;

growing a liner oxidation layer overlying said semiconductor substrate, said pad oxide layer, and said polysilicon layer inside said trenches wherein a portion of said polysilicon layer adjacent to said inside of said trenches is oxidized and wherein said growing is by a thermal oxidation at a temperature of between 900 degrees C. and 1,100 degrees C. for between 8 minutes and 10 minutes;

depositing a trench oxide layer overlying said silicon nitride layer and filling said trenches;

polishing down said trench oxide layer to said silicon nitride layer;

etching away said silicon nitride layer wherein said liner oxidation layer and oxidized said polysilicon layer protect said trench oxide layer during said etching away;

etching away said polysilicon layer wherein said liner oxidation layer protects said trench oxide layer and oxidized said polysilicon layer during said etching away; and etching away said pad oxide layer to complete said shallow trench isolations in the manufacture of said integrated circuit wherein said liner oxidation layer and said oxidized polysilicon layer protect said trench oxide layer during said etching away.

10. The method according to claim 9 wherein said polysilicon layer is deposited to a thickness of between about 400 Angstroms and 600 Angstroms.

11. The method according to claim 9 wherein said silicon nitride layer is deposited to a thickness of between about 1,800 Angstroms and 2,200 Angstroms.

12. The method according to claim 9 wherein said liner oxidation layer is grown to a thickness of between about 230 Angstroms and 270 Angstroms.

13. The method according to claim 9 wherein said trench oxide layer is deposited to a thickness of between about 6,200 Angstroms and 6,900 Angstroms.

14. The method according to claim 9 further comprising ion implanting said polysilicon layer to increase the oxidation rate of said polysilicon layer.

15. A method to form shallow trench isolations in the manufacture of an integrated circuit device comprising:

providing a semiconductor substrate;

growing a pad oxide layer overlying said semiconductor substrate;

depositing a polysilicon layer overlying said pad oxide layer;

ion implanting said polysilicon layer to increase the oxidation rate of said polysilicon layer;

depositing a silicon nitride layer overlying said polysilicon layer;

patterning said silicon nitride layer, said polysilicon layer, said pad oxide layer, and said semiconductor substrate to form trenches for planned shallow trench isolations;

growing a liner oxidation layer overlying said semiconductor substrate, said pad oxide layer, and said polysilicon layer inside said trenches wherein said growing is by a thermal oxidation at a temperature of between about 900 degrees C. and 1,100 degrees C. for between about 8 minutes and 10 minutes;

depositing a trench oxide layer overlying said silicon nitride layer and filling said trenches;

polishing down said trench oxide layer to said silicon nitride layer;

etching away said silicon nitride layer wherein said liner oxidation layer and oxidized said polysilicon layer protect said trench oxide layer during said etching away;

etching away said polysilicon layer wherein said liner oxidation layer and oxidized said polysilicon layer protect said trench oxide layer during said etching away; and etching away said pad oxide layer to complete said shallow trench isolations in the manufacture of said integrated circuit wherein said liner oxidation layer and oxidized said polysilicon layer protect said trench oxide layer during said etching away.

16. The method according to claim 15 wherein said polysilicon layer is deposited to a thickness of between about 400 Angstroms and 600 Angstroms.

17. The method according to claim 15 wherein said silicon nitride layer is deposited to a thickness of between about 1,800 Angstroms and 2,200 Angstroms.

18. The method according to claim 15 wherein said liner oxidation layer is grown to a thickness of between about 230 Angstroms and 270 Angstroms.

* * * * *